US007200039B2

(12) United States Patent
Lee

(10) Patent No.: US 7,200,039 B2
(45) Date of Patent: Apr. 3, 2007

(54) FLASH MEMORY DEVICE WITH IMPROVED ERASE FUNCTION AND METHOD FOR CONTROLLING ERASE OPERATION OF THE SAME

(75) Inventor: Hee Lee, Kyeongki-Do (KR)

(73) Assignee: Hynix Semiconductor Inc., Icheon-Shi (KR)

( * ) Notice: Subject to any disclaimer, the term of this patent is extended or adjusted under 35 U.S.C. 154(b) by 26 days.

(21) Appl. No.: 11/160,278

(22) Filed: Jun. 16, 2005

(65) Prior Publication Data

US 2006/0203550 A1    Sep. 14, 2006

(30) Foreign Application Priority Data

Mar. 10, 2005   (KR) .................... 10-2005-0020182

(51) Int. Cl.
*G11C 16/04* (2006.01)
(52) U.S. Cl. ............................ 365/185.18; 365/185.2; 365/185.13
(58) Field of Classification Search ........... 365/185.18, 365/185.2, 185.28, 185.13
See application file for complete search history.

(56) References Cited

U.S. PATENT DOCUMENTS

| 5,818,758 | A | * | 10/1998 | Wojciechowski | ...... | 365/185.18 |
| 5,991,198 | A | * | 11/1999 | Song et al. | ............. | 365/185.11 |
| 6,327,194 | B1 | * | 12/2001 | Kurihara et al. | ....... | 365/189.09 |

2005/0018489 A1   1/2005   Hosono

OTHER PUBLICATIONS

Office action for Korean patent applcation No. 2005-20182 filed Mar. 10, 2005.

* cited by examiner

*Primary Examiner*—Gene N. Auduong
(74) *Attorney, Agent, or Firm*—Townsend and Townsend and Crew, LLP

(57) ABSTRACT

The present patent relates to flash memory devices with improved erase function, and method of controlling an erase operation of the same. According to the present patent, the flash memory device includes memory cell blocks, each having a plurality of memory cells sharing local word lines and bit lines, an X-decoder which decodes a row address signal and outputs the decoded signal, a block selection unit, which selects some of the memory cell blocks in response to the decoded signal, and connects local word lines of the selected memory cell blocks to corresponding global word lines, respectively, and a high voltage generator, which generates word line bias voltages in response to one of a read command, a program command and an erase command, and supplies the generated word line bias voltages to the global word lines in response to the decoded signal, respectively, wherein the word line bias voltages, which are generated by the high voltage generator in response to the erase command, have a positive value, respectively. Accordingly, a positive bias voltage is applied to a global word line in an erase operation. It is thus possible to prevent a shallow erase phenomenon of non-selected memory cell blocks due to the leakage current of pass gates.

23 Claims, 9 Drawing Sheets

GK1

GKI

FLASH MEMORY DEVICE WITH IMPROVED ERASE FUNCTION AND METHOD FOR CONTROLLING ERASE OPERATION OF THE SAME

CROSS REFERENCE TO RELATED APPLICATIONS

This application relies for priority upon Korean Patent Application No. 2005-0020182 filed on Mar. 10, 2005, the contents of which are herein incorporated by reference in their entirety.

1. Field of the Patent

The present patent relates to semiconductor memory devices and method of controlling the operation of the same, and more specifically, to flash memory devices and method of controlling the erase operation of the same.

2. Discussion of Related Art

Generally, flash memory devices can be classified into a NOR type, which is generally used to store a small quantity of information at high speed, and a NAND type, which is generally used to store a great amount of information. Further, the flash memory device performs a read operation, a program operation and an erase operation. More particularly, the program operation and the erase operation of the NAND type flash memory device are executed by means of Fowler-Nordheim (FN) tunneling occurring in an insulating film between a P-well and a floating gate of a memory cell. That is, as electrons are implanted into the floating gate of the memory cell by means of FN tunneling, the program operation of the flash memory device is performed. In the program operation, only selected ones of a plurality of memory cells included in a memory cell block are programmed. Moreover, the erase operation of the flash memory device is executed as electrons existing in the floating gate of the memory cell are discharged toward the P-well by means of FN tunneling. In the erase operation, data stored in the entire memory cells included in the memory cell block are erased at the same time. That is, the erase operation is performed on the basis of a memory cell block.

FIG. 1 is a circuit diagram of memory cells and pass gates for explaining the erase operation of a conventional flash memory device.

Referring to FIG. 1, in an erase operation, a bias voltage Vb of 0V is applied to a global word line GWL, and a bulk voltage VBK1 of 20V is applied to P-wells of memory cells CA1 to CAn and CB1 to CBn (where n is an integer). Sources and drains of the memory cells CA1 to CAn and CB1 to CBn are floated. Further, to a gate of a NMOS transistor NM1 connected between a local word line WL1 of a memory cell block A, which is selected (i.e., which will be erased), and to the global word line GWL is applied a block select signal BKSEL1 of a voltage (Vcc) level. To a substrate (not shown) of the NMOS transistor NM1 is applied a bulk voltage VBK2 of 0V. The NMOS transistor NM1 is turned on in response to the block select signal BKSEL1, and the local word line WL1 is connected to the global word line GWL. As a result, a voltage of the local word line WL1 becomes 0V, and a voltage difference of 20V is generated between control gates (not shown) of the memory cells CA1 to CAn connected to the local word line WL1 and the P-wells of the memory cells CA1 to CAn. Accordingly, as electrons of the floating gates of the memory cells CA1 to CAn are discharged toward the P-wells, the erase operation of the memory cell block A is performed.

Meanwhile, a gate of an NMOS transistor NM2 connected between a local word line WL2 of a memory cell block B, which is not selected (i.e., which will not be erased), and the global word line GWL is applied with a block select signal BKSEL2 of 0V. Further, to a substrate of the NMOS transistor NM2 is applied a bulk voltage VBK2 of 0V. The NMOS transistor NM2 is turned off in response to the block select signal BKSEL2, and the local word line WL2 is separated from the global word line GWL. This makes the local word line WL2 floated. Thereafter, the bulk voltage VBK1 of 20V, which is applied to the P-wells of the memory cells CB1 to CBn, is applied to the local word line WL2 by means of a capacitive coupling phenomenon, and a voltage level of the local word line WL2 is boosted to about 19V accordingly. This results in a minute voltage difference of 1 V between the local word line WL2 and the P-wells of the memory cells CB1 to CBn, whereby electrons are not discharged from the floating gates of the memory cells CB1 to CBn. As a result, while the erase operation of the memory cell block A is performed, the erase operation of the memory cell block B is not performed. Although the NMOS transistor NM2 is turned off, however, the leakage current can be generated in the NMOS transistor NM2. Accordingly, the voltage level of the local word line WL2, which is boosted to the voltage level close to the bulk voltage VBK1, can gradually decrease. This leads to an increase in a voltage difference between the control gates and the P-wells of the memory cells CB1 to CBn. Therefore, there is a problem in that a phenomenon (i.e., a shallow erase) in which a small amount of electrons is discharged from floating gates of memory cells CB1 to CBn that should not be erased. Erase disturbance, such as shallow erase, becomes more profound when the number of memory cell blocks included in a flash memory device increases. For example, whenever memory cell blocks perform an erase operation one by one, a shallow erase phenomenon is repeatedly generated in memory cells of memory cell blocks that should not be erased. Consequently, as the threshold voltages of corresponding memory cells gradually decrease, there is a problem in that fail occurs in the read operation.

SUMMARY

Accordingly, the present patent addresses the above problems, and discloses flash memory devices in which a shallow erase phenomenon of non-selected memory cell blocks due to the leakage current of pass gates can be prevented by applying a positive bias voltage to a global word line in an erase operation.

The present patent also discloses a method of controlling an erase operation of flash memory devices, wherein a shallow erase phenomenon of non-selected memory cell blocks due to the leakage current of pass gates can be prevented by applying a positive bias voltage to a global word line in an erase operation.

To accomplish this, there is provided a flash memory device, including memory cell blocks, each having a plurality of memory cells sharing local word lines and bit lines, a X-decoder which decodes a row address signal and outputs the decoded signal, a block selection unit, which selects some of the memory cell blocks in response to the decoded signal, and connects local word lines of the selected memory cell blocks to corresponding global word lines, respectively, and a high voltage generator, which generates word line bias voltages in response to one of a read command, a program command and an erase command, and supplies the generated word line bias voltages to the global word lines in response to the decoded signal, respectively, wherein the word line bias voltages, which are generated by the high voltage generator in response to the erase command, have a positive value, respectively.

The present patent also discloses a method of controlling an erase operation of a flash memory device, including the steps of supplying word line bias voltages, each having a positive value, to global word lines, respectively, in response to an erase command and a row address signal, supplying a bulk voltage to memory cells of the entire memory cell blocks, floating drains and sources of the memory cells by supplying a ground voltage to a global drain select line and a global source select line, and selecting one of the memory cell blocks in response to the row address signal, and connecting local word lines of the selected memory cell block to the global word lines.

DETAILED DESCRIPTION OF VARIOUS EMBODIMENTS

Now, the various embodiments according to the present patent will be described with reference to the accompanying drawings. Because various embodiments are provided for the purpose that the ordinary persons skilled in the art are able to understand the present patent, they may be modified in various manners and the scope of the present patent is not limited by the various embodiments described later.

Figure 1:
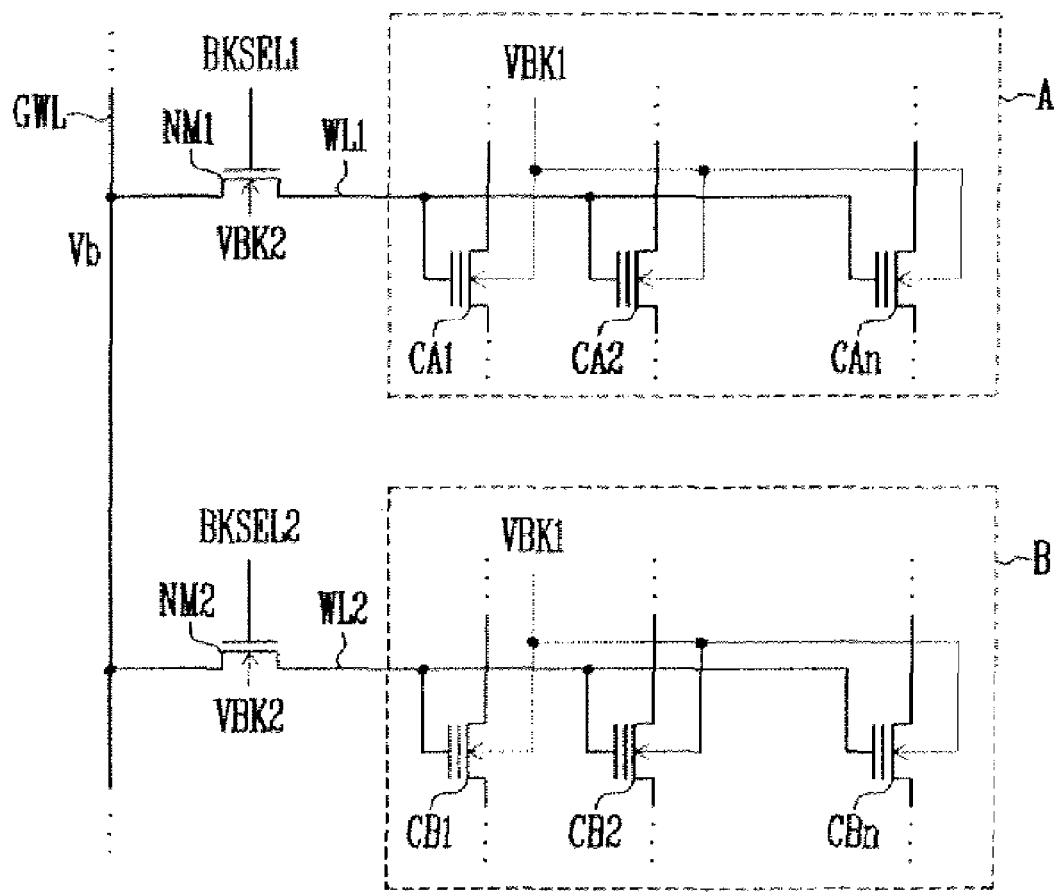
FIG. 1 is a circuit diagram of memory cells and pass gates illustrating the erase operation of a conventional flash memory device.
Figure 2:
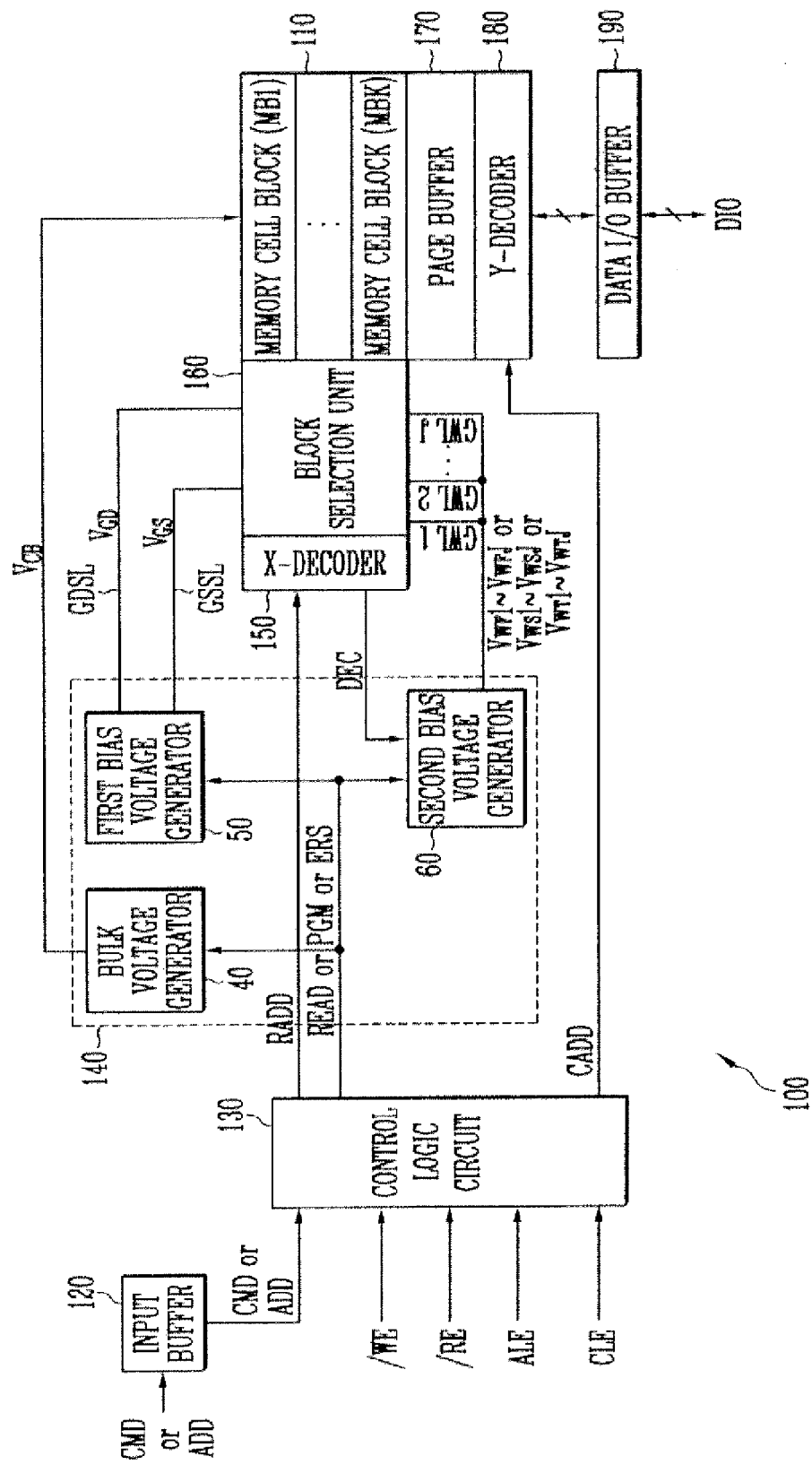
FIG. 2 is a block diagram of an exemplary flash memory device according to an embodiment of the present patent.

FIG. 2 is a block diagram of a flash memory device according to an embodiment of the present patent.

Referring to FIG. 2, a flash memory device 100 includes a memory cell array 110, an input buffer 120, a control logic circuit 130, a high voltage generator 140, a X-decoder 150, a block selection unit 160, a page buffer 170, a Y-decoder 180 and a data I/O buffer 190. The memory cell array 110 includes memory cell blocks MB1 to MBK (where K is an integer), each having a plurality of memory cells (not shown). The input buffer 120 receives a command signal CMD or an address signal ADD, and outputs them to the control logic circuit 130. The control logic circuit 130 receives the command signal CMD or the address signal ADD in response to external control signals /WE, /RE, ALE and CLE. The control logic circuit 130 generates one of a read command READ, a program command PGM and an erase command ERS in response to the command signal CMD. The control logic circuit 130 generates a row address signal RADD and a column address signal CADD in response to the address signal ADD.

The high voltage generator 140 includes a bulk voltage generator 40, a first bias voltage generator 50 and a second bias voltage generator 60. The bulk voltage generator 40 generates a bulk voltage $V_{CB}$ in response the read command READ, the program command PGM and the erase command ERS, and supplies the bulk voltage $V_{CB}$ to P-wells of the memory cells. More particularly, the bulk voltage generator 40 generates the bulk voltage $V_{CB}$ at a low voltage (e.g., 0V) level in response to the read command READ or the program command PGM. The bulk voltage generator 40 also generates the bulk voltage $V_{CB}$ at a high voltage (e.g., 20V) level in response to the erase command ERS.

The first bias voltage generator 50 generates a drain bias voltage $V_{GD}$ and a source bias voltage $V_{GS}$ in response to one of the read command READ, the program command PGM and the erase command ERS, and supplies the drain bias voltage $V_{GD}$ to a global drain select line GDSL and the source bias voltage $V_{GS}$ to a global source select line GSSL. More particularly, the first bias voltage generator 50 generates the drain bias voltage $V_{GD}$ and the source bias voltage $V_{GS}$ at a high voltage (e.g., 4.5V) level in response to the read command READ. The first bias voltage generator 50 also generates the drain bias voltage $V_{GD}$ at an internal voltage (VCC, not shown) level and the source bias voltage $V_{GS}$ at a low voltage level in response to the program command PGM. Furthermore, the first bias voltage generator 50 generates the drain bias voltage $V_{GD}$ and the source bias voltage $V_{GS}$ at a low voltage level in response to the erase command ERS.

The second bias voltage generator 60 generates word line bias voltages $V_{WF}1$ to $V_{WF}J$ (where J is an integer), word line bias voltages $V_{WS}1$ to $V_{WS}J$ (where J s an integer) or word line bias voltages $V_{WT}1$ to $V_{WT}J$ (where J is an integer) in response to one of the read command READ, the program command PGM, and the erase command ERS, and a decoding signal DEC, and supplies the generated word line bias voltages to global word lines GWL1 to GWLJ (where J is an integer). In more detail, the second bias voltage generator 60 generates the word line bias voltages $V_{WT}1$ to $V_{WT}J$ in response to the read command READ. The second bias voltage generator 60 generates the word line bias voltages $V_{WS}1$ to $V_{WS}J$ in response to the program command PGM. The second bias voltage generator 60 generates the word line bias voltages $V_{WT}1$ to $V_{WT}J$ in response to the erase command ERS.

The X-decoder 150 decodes the row address signal RADD, and outputs a decoding signal DEC. The block selection unit 160 selects one or more of the memory cell blocks MB1 to MBK in response to the decoding signal DEC, and connects local word lines WL11 to WL1J (See FIG. 3) of a selected memory cell block (or a memory cell block) to the global word lines GWL1 to GWLJ, respectively. The block selection unit 160 connects one of drain select lines DSL1 to DSLK (See FIG. 3) of the selected memory cell block to the global drain select line GDSL, and connects one of source select lines SSL1 to SSLK (See FIG. 3) of the selected memory cell block to the global source select line GSSL. The construction and detailed operation of the page buffer 170, the Y-decoder 180 and the data I/O buffer 190 can be easily understood by those skilled in the art. Detailed description thereof will be thus omitted for simplicity.

Figure 3:
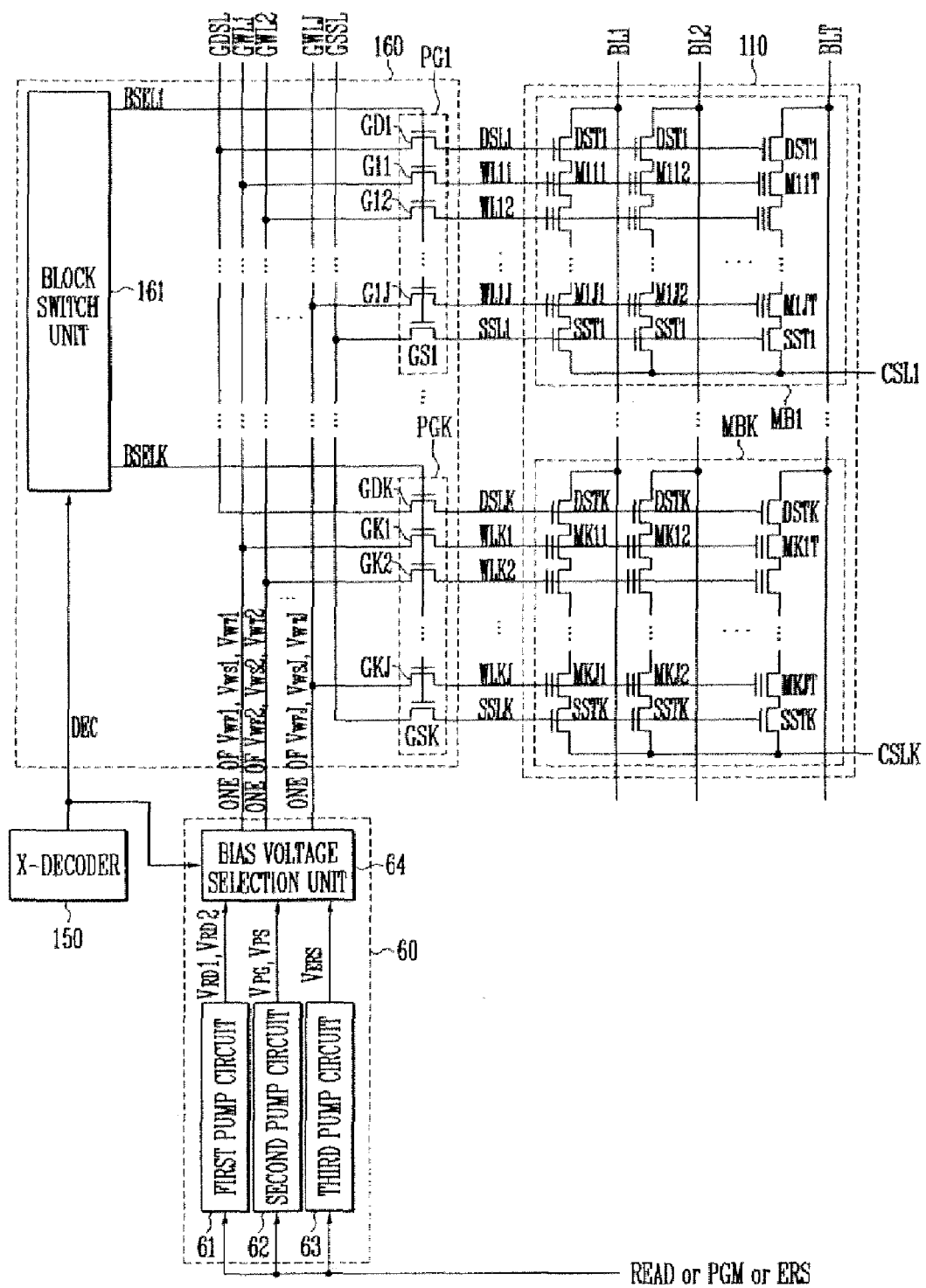
FIG. 3 is a detailed circuit diagram of an exemplary memory cell array, a block selection unit, a second bias voltage generator and a X-decoder shown in FIG. 2.

FIG. 3 is a detailed circuit diagram of a memory cell array, a block selection unit, a second bias voltage generator and a X-decoder shown in FIG. 2.

Referring to FIG. 3, the memory cell block MB1 of the memory cell array 110 includes memory cells M111 to M1JT (where J and T are integers), a drain select transistor DST1 and a source select transistor SST1. The memory cells M111 to M1JT share bit lines BL1 to BLT (where T is an integer), local word lines WL11 to WL1J (where J is an integer), and a common source line CSL1. That is, the memory cells M111 to M11T are connected to the bit lines BL1 to BLT, respectively, through the drain select transistor(s) DST1, and the memory cells M1J1 to M1JT are connected to the common source line CSL1 through the source select transistor(s) SST1. Further, gates of the memory cells M111 to M1JT are connected to the local word lines WL11 to WL1J. Meanwhile, a gate(s) of the drain select transistor(s) DST1 is connected to the local drain select line DSL1, and a gate(s) of the source select transistor(s) SST1 is connected to a local source select line SSL1.

The construction of the memory cell blocks MB2 to MBK of the memory cell array 110 is the same as that of the memory cell block MB1. Detailed description thereof will be thus omitted in order to avoid redundancy. The block selection unit 160 includes a block switch unit 161 and pass gate circuits PG1 to PGK (where K is an integer). The block switch unit 161 outputs block select signals BSEL1 to BSELK (where K is an integer) in response to the decoding signal DEC received from the X-decoder 150. The pass gate circuits PG1 to PGK are disposed corresponding to the memory cell blocks MB1 to MBK, respectively, and are enabled or disabled in response to the block select signals BSEL1 to BSELK.

Each of the pass gate circuits PG1 to PGK includes a plurality of pass gates. For example, the pass gate circuit PG1 has pass gates GD1, G11 to G1J, and GS1. The construction and detailed operation of the pass gate circuits PG2 to PGK are similar to those of the pass gate circuit PG1. Thus, description will be given on the basis of the operation of the pass gate circuit PG1. Preferably, the pass gates GD1, G11 to G1J, and GS1 can be implemented using NMOS transistors. Hereinafter, the pass gates GD1, G11 to G1J, and GS1 will be referred to as the "NMOS transistors". To gates of the NMOS transistors GD1, G11 to G1J, and GS1 are input the block select signal BSEL1. The NMOS transistor GD1 has a source connected to the global drain select line GDSL, and a drain connected to the local drain select line DSL1. The NMOS transistors G11 to G1J have sources connected to the global word lines GWL1 to GWLJ, respectively, and drains connected to the local word lines WL11 to WL1J, respectively. The NMOS transistor GS1 has a source connected to the global source select line GSSL, and a drain connected to the local source select line SSL1. The NMOS transistors GD1, G11 to G1J, and GS1 are turned on or off at the same time in response to the block select signal BSEL1. More particularly, when the block select signal BSEL1 is enabled, the NMOS transistors GD1, G11 to G1J, and GS1 are turned on, and when the block select signal BSEL1 is disabled, the NMOS transistors GD1, G11 to G1J, and GS1 are turned off. When the NMOS transistors GD1, G11 to G1J, and GS1 are turned on, the global drain select line GDSL is connected to the local drain select line DSL1, the global source select line GSSL is connected to the local source select line SSL1, and the global word lines GWL1 to GWLJ are connected to the local word lines WL11 to WL1J, respectively.

The second bias voltage generator 60 includes first to third pump circuits 61, 62 and 63, and a bias voltage selection unit 64. The first pump circuit 61 generates read voltages $V_{RD}1$ and $V_{RD}2$ in response to the read command READ. Preferably, the read voltage $V_{RD}1$ has a high voltage (e.g., 4.5V) level, and the read voltage $V_{RD}2$ has a low voltage (e.g., 0V) level. In a read operation of the memory cell array 110, the read voltage $V_{RD}1$ is applied to local word lines to which gates of non-selected memory cells (i.e., memory cells that will not be read) are connected, and the read voltage $V_{RD}2$ is applied to local word lines to which gates of selected memory cells (i.e., memory cells to be read) are connected.

The second pump circuit 62 generates program voltages $V_{PG}$ and $V_{PS}$ in response to the program command PGM. Preferably, the program voltages $V_{PG}$ and $V_{PS}$ have high voltage levels (e.g., $V_{PG}$=18V, $V_{PS}$=10V), respectively. In a program operation of the memory cell array 110, the program voltage $V_{PG}$ is applied to local word lines to which gates of memory cells to be programmed are connected, and the program (or pass) voltage $V_{PS}$ is applied to local word lines to which gates of memory cells that will not be programmed are connected. Furthermore, the third pump circuit 63 generates an erase voltage $V_{ERS}$ in response to the erase command ERS. The erase voltage $V_{ERS}$ preferably has a positive value, and can be expressed into the following equation 1.

$$V_{CB} - V_{ERS} >= 15V \qquad (1)$$

(where $V_{CB}$ is the bulk voltage applied to the P-well of the memory cell in the erase operation, and $V_{ERS}$ is the erase voltage)

The bias voltage selection unit 64 selects the read voltages $V_{RD}1$ and $V_{RD}2$ in response to the decoding signal DEC received from the X-decoder 150 and then outputs the selected read voltages $V_{RD}1$ and $V_{RD}2$ to the global word lines GWL1 to GWLJ, respectively, as the word line bias voltages $V_{WF}1$ to $V_{WF}J$, selects the program voltages $V_{PG}$ and $V_{PS}$ and then outputs the selected program voltages $V_{PG}$ and $V_{PS}$ to the global word lines GWL1 to GWLJ, respectively, as word line bias voltages $V_{WS}1$ to $V_{WS}J$ (where J is an integer), or selects the erase voltage $V_{ERS}$ and then outputs the selected erase voltage $V_{ERS}$ to the global word lines GWL1 to GWLJ as word line bias voltages $V_{WT}1$ to $V_{WT}J$. The entire construction and operation of the first to third pump circuits 61, 62 and 63 can be understood by a person having ordinary skill in the art, and will be thus omitted for simplicity.

Figure 4:
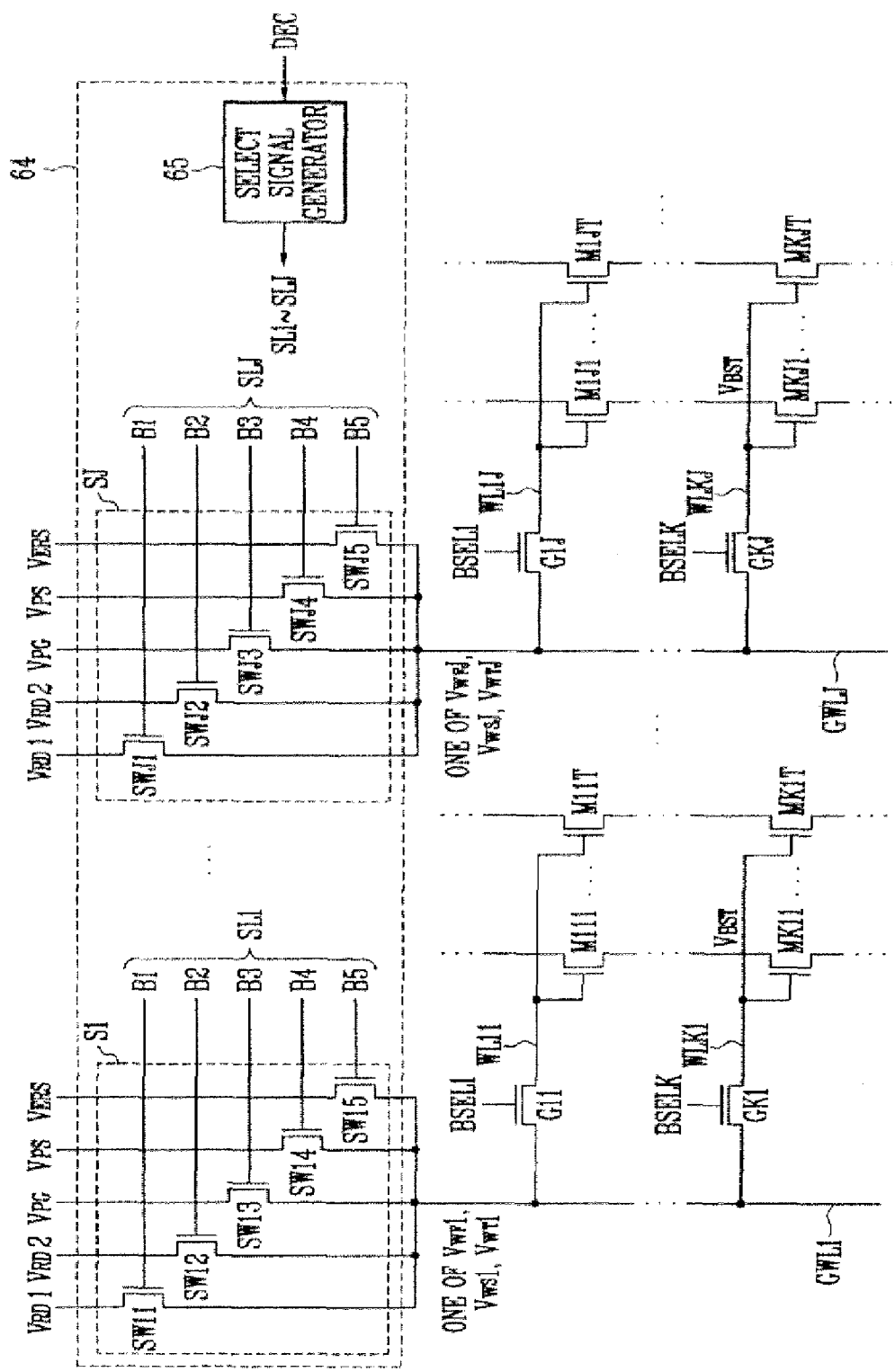
FIG. 4 is an exemplary circuit diagram of memory cells, pass gates, and a bias voltage selection unit shown in FIG. 3.

FIG. 4 is a detailed circuit diagram of memory cells, pass gates, and a bias voltage selection unit shown in FIG. 3.

Referring to FIG. 4, the bias voltage selection unit 64 includes a select signal generator 65 and select circuits S1 to SJ (where J is an integer). The select signal generator 65 generates select signals SL1 to SLJ based on the decoding signal DEC. Each of the select circuits S1 to SJ includes switches SW11 to SW15, . . . , SWJ1 to SWJ5 respectively connected to the global word lines GWL1 to GWLJ. Each of the select circuits S1 to SJ receives the read voltages $V_{RD}1$ and $V_{RD}2$, the program voltages $V_{PG}$ and $V_{PS}$, and the erase voltage $V_{ERS}$, and outputs word line bias voltages $V_{WF}1$ to $V_{WF}J$, $V_{WS}1$ to $V_{WS}J$ or $V_{WT}1$ to $V_{WT}J$ to the global word lines GWL1 to GWLJ in response to the select signal SL1 to SLJ. This will be described in more detail. For example, the switches SW11 to SW15 of the select circuit S1 are connected between the read voltages $V_{RD}1$ and $V_{RD}2$, the program voltages $V_{PG}$ and $V_{PS}$, and the erase voltage $V_{ERS}$, and the global word line GWL1, respectively. The switches SW11 to SW15 are turned on or off according to logic values of the bits B1 to B5 of the select signal SL1. In this case, in the event that the switches SW11 to SW15 are implemented using NMOS transistors, when logic values of the bits B1 to B5 are 1, the switches SW11 to SW15 are turned on. Meanwhile, when the logic values of the bits B1 to B5 are 0, the switches SW11 to SW15 are turned off.

For example, when one of the switches SW11 and SW12 is on, one of the read voltages $V_{RD}1$ and $V_{RD}2$ is input to the global word line GWL1 as the word line bias voltage $V_{WF}1$. Furthermore, when one of the switches SW13 and SW14 is on, one of the program voltages $V_{PG}$ and $V_{PS}$ is input to the global word line GWL1 as the word line bias voltage $V_{WS}1$. Moreover, when the switch SW15 is on, the erase voltage $V_{ERS}$ is input to the global word line GWL1 as the word line bias voltage $V_{WT}1$. In this case, because the select signal generator 65 generates a logic value of one of the bits B1 to B5 as 1 and logic values of the remaining bits as 0, one of the switches SW11 to SW15 is turned on, and the remaining switches are turned off. As a result, one of the read voltages $V_{RD}1$ and $V_{RD}2$, the program voltages $V_{PG}$ and $V_{PS}$, and the erase voltage $V_{ERS}$ is applied to the global word line GWL1. The construction and detailed operation of the select circuits S2 to SJ are similar to those of the aforementioned select circuit S1. Detailed description thereof will be thus omitted in order to avoid redundancy.

It has been shown in FIG. 4 that each of the select circuits S1 to SJ has five switches. It is, however, to be noted that the construction of the select circuits S1 to SJ can be changed in various manners as long as each of the select circuits S1 to SJ outputs the word line bias voltages $V_{WF}1$ to $V_{WF}J$, $V_{WS}1$ to $V_{WS}J$ or $V_{WT}1$ to $V_{WT}J$.

Furthermore, for simplification of the drawing, only the NMOS transistors G11, GK1, G1J and GKJ connected to the global word lines GWL1 and GWLJ, the local word lines WL11, WL1J, WLK1 and WLKJ, and the memory cells M111, M11T, M1J1, M1JT, MK11, MK1T, MKJ1 and MKJT are shown in FIG. 4. To the local word line WL11 is connected the gates of the memory cells M111 to M11T, and to the local word line WL1J are connected the gates of the memory cells M1J1 to M1JT. Further, to the local word line WLK1 are connected the gates of the memory cells MK11 to MK1T, and to the local word line WLKJ are connected the gates of the memory cells MKJ1 to MKJT. Source and drain of the NMOS transistor G11 are connected to the global word line GWL1 and the local word line WL11, respectively, and source and drain of the NMOS transistor GK1 are connected to the global word line GWL1 and the local word line WLK1, respectively. Further, source and drain of the NMOS transistor G1J are connected to the global word line GWLJ and the local word line WL1J, respectively, and source and drain of the NMOS transistor GKJ are connected to the global word line GWLJ and the local word line WLKJ, respectively.

The erase operation of the flash memory device 100 will now be described in more detail with reference to FIGS. 2 to 4. The control logic circuit 130 generates the erase command ERS in response to the external control signals /WE, /RE, ALE and CLE and the command signal CMD, and generates the row address signal RADD based on the address signal ADD. The bulk voltage generator 40 of the high voltage generator 140 generates the bulk voltage VCB at a high voltage (e.g., 20V) level in response to the erase command ERS, and supplies the generated bulk voltage VCB to the memory cells of the memory cell blocks MB1 to MBK. Furthermore, the first bias voltage generator 50 of the high voltage generator 140 generates the drain bias voltage $V_{GD}$ and the source bias voltage $V_{GS}$ at a low voltage (e.g., 0V) in response to the erase command ERS. Accordingly, the drain bias voltage $V_{GD}$ is applied to the global drain select line GDSL, and the source bias voltage $V_{GS}$ is applied to the global source select line GSSL. Meanwhile, the X-decoder 150 decodes the row address signal RADD, and outputs the decoding signal DEC. The second bias voltage generator 60 of the high voltage generator 140 generates the word line bias voltages $V_{WT}1$ to $V_{WT}J$ in response to the erase command ERS and the decoding signal DEC, and supplies the generated voltages to the global word lines GWL1 to GWLJ, respectively. More particularly, the third pump circuit 63 of the second bias voltage generator 60 generates the erase voltage $V_{ERS}$ having a positive value in response to the erase command ERS. For example, the erase voltage $V_{ERS}$ is lower than the bulk voltage $V_{CB}$ that is supplied to the P-well of the memory cell in the erase operation, and has a positive value. Preferably, a difference between the bulk voltage $V_{CB}$ and the erase voltage $V_{ERS}$, which are supplied to a P-well of a memory cell in the erase operation, can be set to be higher than or the same as 5V. The bias voltage selection unit 64 of the second bias voltage generator 60 selects the erase voltage VERS in response to the decoding signal DEC, and outputs the selected voltage as the word line bias voltages $V_{WT}1$ to $V_{WT}J$. In more detail, the select signal generator 65 of the bias voltage selection unit 64 outputs the values of the bits B1 to B5 of the select signals SL1 to SLJ as all "00001" in response to the decoding signal DEC. The switches SW15 to SWJ5 of the select circuits S1 to SJ of the bias voltage selection unit 64 are turned on, and the switches SW11 to SWJ1, SW12 to SWJ2, SW13 to SWJ3 and SW14 to SWJ4 are all turned off, in response to the select signals SL1 to SLJ. Accordingly, the erase voltage $V_{ERS}$ is input to the global word lines GWL1 to GWLJ as the word line bias voltages $V_{WT}1$ to $V_{WT}J$ through the switches SW15 to SWJ5.

Furthermore, the block selection unit 160 selects one of the memory cell blocks MB1 to MBK in response to the decoding signal DEC, and connects local word lines of a selected memory cell block to the global word lines GWL1 to GWLJ, respectively. For example, if the memory cell block MB1 is selected, the block switch unit 161 of the block selection unit 160 enables the block select signal BSEL1 in response to the decoding signal DEC, and disables all the block select signals BSEL2 to BSELK. As a result, only the pass gate circuit PG1 of the block selection unit 160 is enabled, and the pass gate circuits PG2 to PGK are all disabled. In more detail, the pass gates GD1, G11 to G1J and GS1 of the pass gate circuit PG1 are turned on at the same time, and the pass gates GD2 to GDK, G21 to 2J, . . . GK1 to GKJ, GS2 to GSK of the pass gate circuits PG2 to PGK are all turned off. Accordingly, the drain select line DSL1 of the memory cell block MB1 is connected to the global drain select line GDSL, and the source select line SSL1 is connected to the global source select line GSSL. Consequently, as the drain bias voltage $V_{GD}$ and the source bias voltage $V_{GS}$ of a low voltage level are applied to the drain select line DSL1 and the source select line SSL1, respectively, the drain select transistor DST1 and the source select transistor SST1 are turned off. Accordingly, drains and sources of the memory cells M111 to M1JT of the memory cell block MB1 become floated.

In addition, the local word lines WL11 to WL1J of the memory cell block MB1 are connected to the global word lines GWL1 to GWLJ, respectively. As a result, the word line bias voltages $V_{WT}1$ to $V_{WT}J$ of the global word lines GWL1 to GWLJ are transferred to the local word lines WL11 to WL1J, respectively. Therefore, a voltage difference (e.g., 15V or more) is generated between gates and bulks of the memory cells M111 to M1JT of the memory cell block MB1, and electrons are discharged from the floating gates of the memory cells M111 to M1JT by means of the voltage difference, whereby the erase operation of the memory cells M111 to M1JT is performed.

Figure 5A:
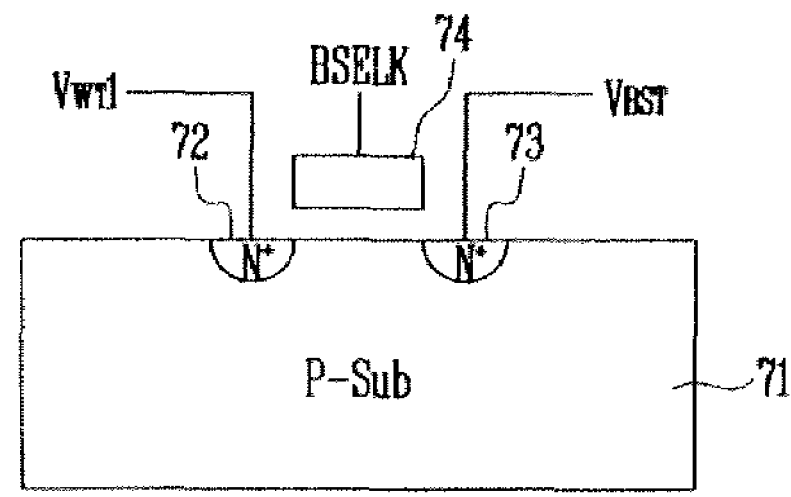
FIG. 5a is an exemplary cross-sectional view of the pass gate shown in FIG. 4.
Figure 5B:
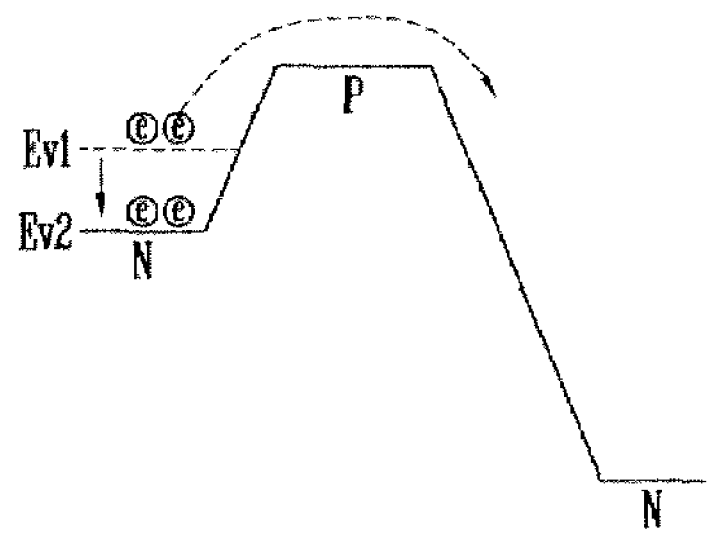
FIG. 5b is an exemplary view showing variations of the energy potential of the pass gate depending upon variations of the bias voltage of the word line shown in FIG. 4.

Meanwhile, the drain select lines DSL2 to DSLJ of the memory cell blocks MB2 to MBK are separated from the global drain select line GDSL, and the source select lines SSL2 to SSLJ are also separated from the global source select line GSSL. Furthermore, the local word lines WL21 to WL2J, ..., WLK1 to WLKJ of the memory cell blocks MB2 to MBK are all separated from the global word lines GWL1 to GWLJ. Accordingly, the local word lines WL21 to WL2J, ..., WLK1 to WLKJ are boosted by means of the bulk voltage $V_{CB}$ of a high voltage (e.g., 20V) level, which is applied to the memory cells of the memory cell blocks MB2 to MBK. Consequently, the boosting voltage $V_{BST}$ close to the bulk voltage $V_{CB}$ is generated in the local word lines WL21 to WL2J, ..., WLK1 to WLKJ. In this case, the operation of the NMOS transistors G21 to G2J, ..., GK1 to GKJ, which are connected between the local word lines WL21 to WL2J, ..., WLK1 to WLKJ of the memory cell blocks MB2 to MBK and the global word lines GWL1 to GWLJ, will be described in more detail with reference to FIGS. 5a and 5b. FIGS. 5a and 5b show a cross-sectional view of the NMOS transistor GK1, and the energy potential thereof, respectively. The operation of the NMOS transistors G21 to G2J, ..., GK2–GKJ is similar to that of the NMOS transistor GK1. Detailed description thereof will be thus omitted for simplicity.

FIG. 5a is a cross-sectional view of the NMOS transistor GK1 being a pass gate, which is connected to the local word line WLK1 of the memory cell block MBK. A source 72 of the NMOS transistor GK1 is applied with the word line bias voltage $V_{WT}1$ having a positive value, and a gate 74 thereof is applied with the block select signal BSELK having a low voltage (e.g., 0V) level. A drain 73 of the NMOS transistor GK1 is also input with the boosting voltage $V_{BST}$. As the block select signal BSELK is at a low level, the NMOS transistor GK1 is turned off. Further, because the word line bias voltage $V_{WT}1$ has the positive value, the energy potential of the source 72 region decreases to approximately Ev2, as shown in FIG. 5b. Accordingly, the amount of electrons, which is introduced from the source 72 to a substrate 71, is reduced, the amount of electrons, which is introduced into the local word line WLK1 connected to the drain 73 reduces. As a result, as the leakage current generated in the NMOS transistor GK is reduced, the local word line WLK1 is kept to the boosting voltage $V_{BST}$ level. Therefore, data of memory cells connected to the local word line WLK1 are not erased.

Meanwhile, in contrast to the above description, in the case where the word line bias voltage $V_{WT}1$ of 0V is applied to the source 72, the energy potential of the source 72 region increases to approximately Ev1, as shown in FIG. 5b. Accordingly, the amount of electrons that are introduced from the source 72 to the substrate 71 increases, the amount of the leakage current of the NMOS transistor GK1 increases. Therefore, in order to reduce the leakage current of the NMOS transistor GK1, the energy potential of the source 72 region needs to be reduced.

Figure 6:
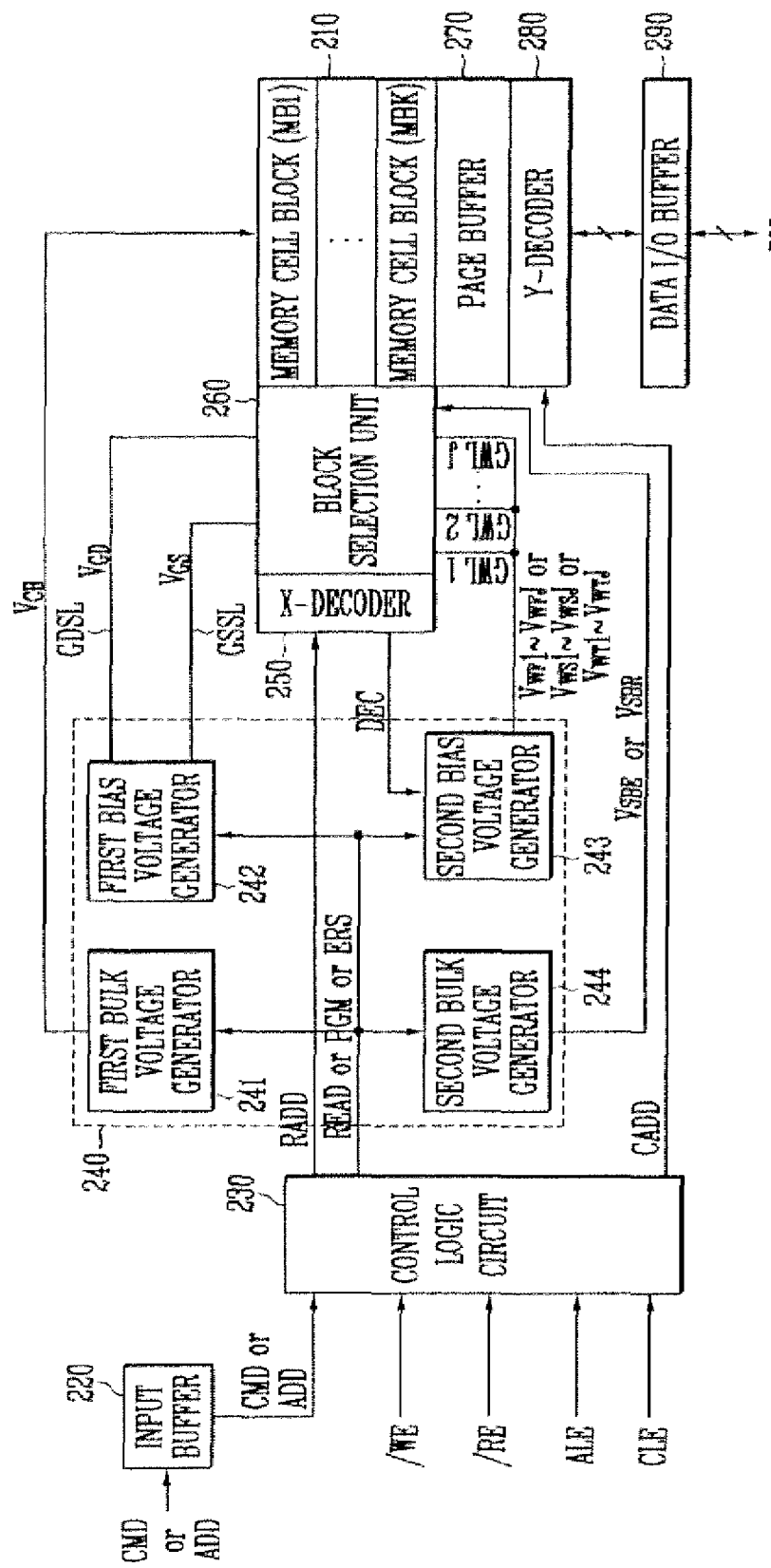
FIG. 6 is an exemplary block diagram of a flash memory device according to another embodiment of the present patent.

FIG. 6 is a block diagram of a flash memory device according to another embodiment of the present patent.

Referring to FIG. 6, a flash memory device 200 includes a memory cell array 210, an input buffer 220, a control logic circuit 230, a high voltage generator 240, a X-decoder 250, a block selection unit 260, a page buffer 270, a Y-decoder 280 and a data I/O buffer 290. The construction and overall operation of the flash memory device 200 are the same as those of the flash memory device 100 described with reference to FIG. 2 except for the high voltage generator 240. Thus, in order to avoid redundancy, only the operation of the high voltage generator 240 will be described in FIG. 6. The high voltage generator 240 includes a first bulk voltage generator 241, a first bias voltage generator 242, a second bias voltage generator 243 and a second bulk voltage generator 244. The operation of the first bulk voltage generator 241, the first bias voltage generator 242 and the second bias voltage generator 243 are the same as those of the bulk voltage generator 40, the first bias voltage generator 50 and the second bias voltage generator 60 of the high voltage generator 140. Detailed description thereof will be omitted accordingly. The second bulk voltage generator 244 supplies one of a bulk voltage for erase $V_{SBE}$ and a reference bulk voltage $V_{SBR}$ to the block selection unit 260 in response to an erase command ERS. In more detail, when the erase command ERS is disabled, i.e., the read command READ or the program command PGM is enabled (or generated), the second bulk voltage generator 244 applies the reference bulk voltage $V_{SBR}$ to the block selection unit 260. Further, when the erase command ERS is enabled, the second bulk voltage generator 244 supplies the bulk voltage for erase $V_{SBE}$ to the block selection unit 260.

Figure 7:
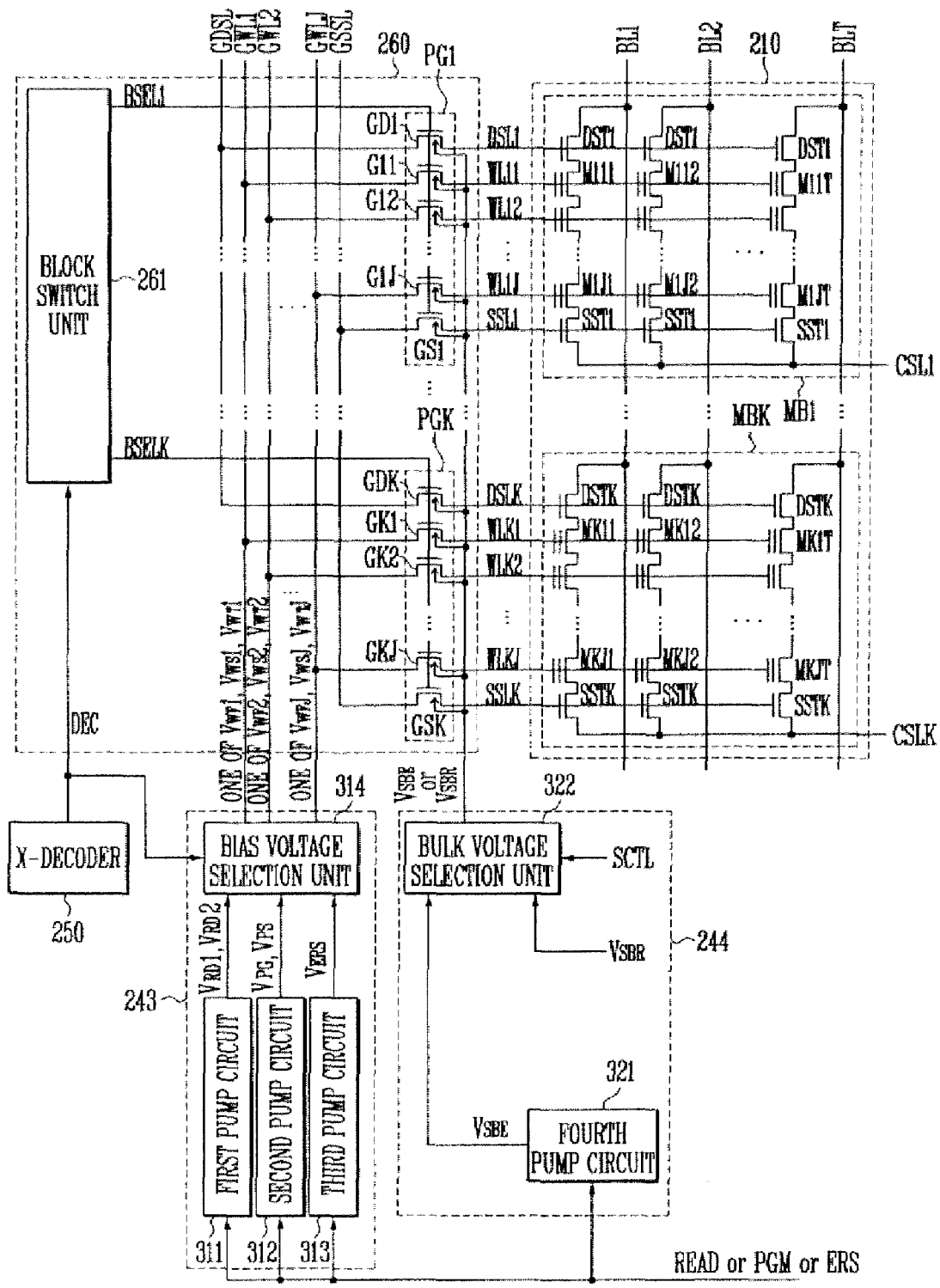
FIG. 7 is an exemplary circuit diagram of a memory cell array, a block selection unit, a second bias voltage generator, a second bulk voltage generator and a X-decoder shown in FIG. 6.

FIG. 7 is a detailed circuit diagram of the memory cell array 210, the block selection unit 260, the second bias voltage generator 243, the second bulk voltage generator 244 and the X-decoder 250 shown in FIG. 6. The construction and overall operation of the memory cell array 210, the block selection unit 260, the second bias voltage generator 243 and the X-decoder 250 are the same as those of the memory cell array 110, the block selection unit 160, the second bias voltage generator 60 and the X-decoder 150, which have been described with reference to FIG. 3. Detailed description thereof will be thus omitted in order to avoid redundancy. The second bulk voltage generator 244 includes a fourth pump circuit 321 and a bulk voltage selection unit 322. The fourth pump circuit 321 generates a bulk voltage for erase $V_{SBE}$ in response to the erase command ERS. The bulk voltage for erase $V_{SBE}$ preferably has a negative value, and can be expressed into the following equation.

$$V_{CB} - V_{SBE} \supseteq \text{Junction breakdown voltage of pass gate} \quad (2)$$

($V_{CB}$ is the bulk voltage applied to P-well of memory cell in the erase operation, and $V_{SBE}$ is the bulk voltage for erase)

The overall construction and operation of the fourth pump circuit 321 can be understood by those skilled in the art. Detailed description thereof will be thus omitted for simplicity.

The bulk voltage selection unit 322 selects one of the bulk voltage for erase $V_{SBE}$ and the reference bulk voltage $V_{SBR}$ in response to the select control signal SCTL, and supplies the selected voltage to the pass gate circuits PG1 to PGK of the block selection unit 260. More particularly, when the select control signal SCTL is enabled, the bulk voltage selection unit 322 selects the bulk voltage for erase $V_{SBE}$, and supplies the selected voltage to the pass gates GD1 to GDK, G11 to G1J, . . . GK1 to GKJ, GS1 to GSK of the pass gate circuits PG1 to PGK. In this case, the select control signal SCTL is enabled during a time set when the erase command ERS is enabled, and the reference bulk voltage $V_{SBR}$ has a ground voltage level as a voltage input to the bulk of the flash memory device 200.

Figure 8:
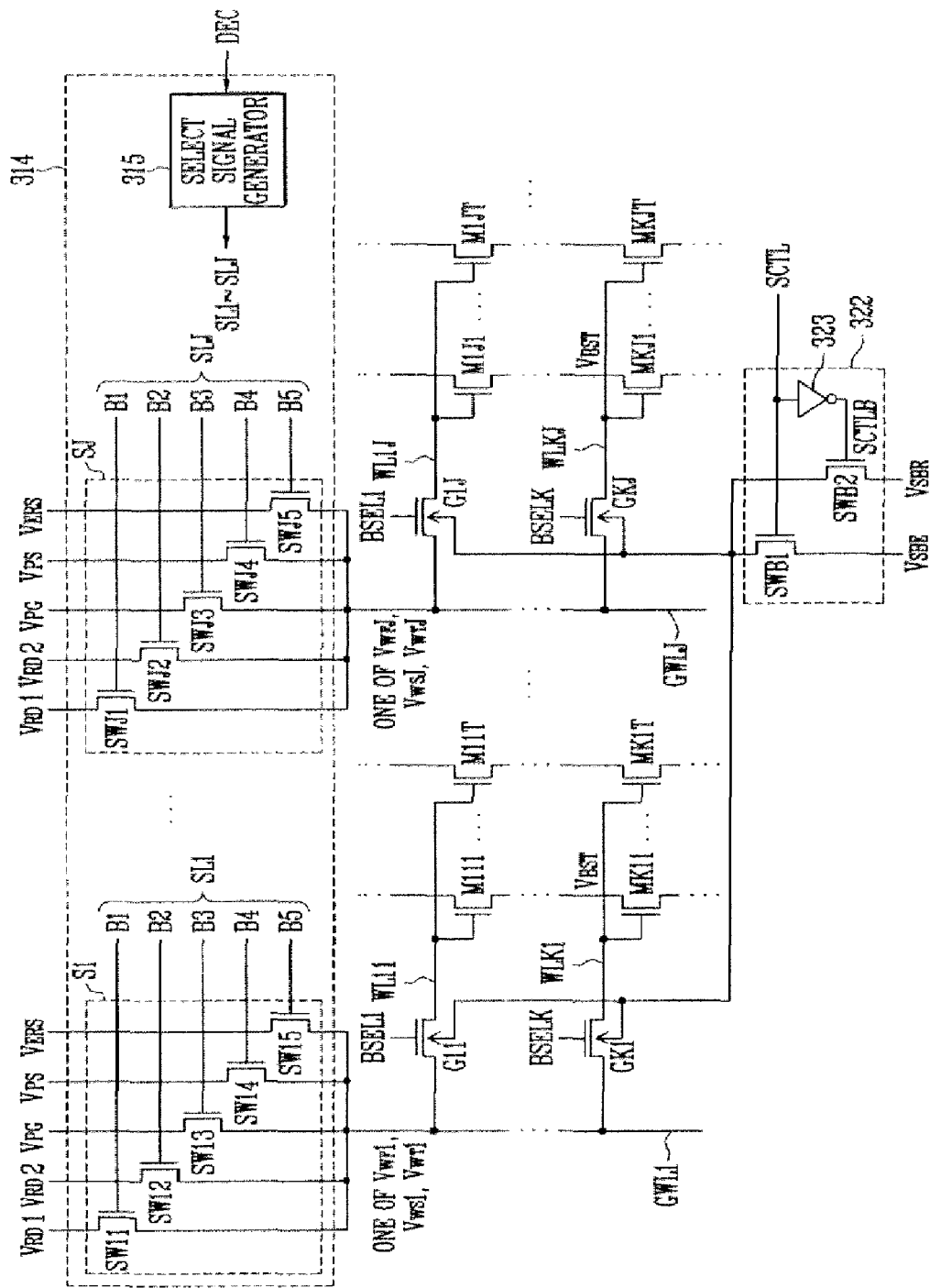
FIG. 8 is an exemplary circuit diagram of memory cells, pass gates, a bias voltage selection unit, and a bulk voltage selection unit shown in FIG. 7.

FIG. 8 is a detailed circuit diagram of the memory cells 210, the pass gates, the bias voltage selection unit 314 and the bulk voltage selection unit 322 shown in FIG. 7. Components other than a bulk voltage selection unit 322 are the same as those shown in FIG. 4. Detailed description thereof will be thus omitted in order to avoid redundancy. Referring to FIG. 8, the bulk voltage selection unit 322 has an inverter 323 and switches SWB1 and SWB2. The inverter 323 inverts a select control signal SCTL, and outputs an inverted select control signal SCTLB. The switch SWB1 is turned on or off in response to the select control signal SCTL. When the switch SWB1 is turned on, it outputs the bulk voltage for erase $V_{SBE}$ to the pass gates G11 to G1J, . . . , GK1 to GKJ. Further, the switch SWB2 is turned on or off in response to the inverted select control signal SCTLB. When the switch SWB2 is turned on, it outputs the reference bulk voltage $V_{SBR}$ to the pass gates G11 to G1J, . . . , GK1 to GKJ. In this case, the pass gates G11 to G1J, . . . GK1 to GKJ have a triple well structure, as shown in FIG. 9a.

The erase operation of the flash memory device 200 will be now described. For example, a case where the memory cell block MB1 performs the erase operation and the memory cell blocks MB2 to MBK do not perform the erase operation in the flash memory device 200 will be described. In this case, the erase operation of the flash memory device 200 is the same as the erase operation of the flash memory device 100 except in one aspect. The difference is that in the erase operation of the flash memory device 200, the second bulk voltage generator 244 of the high voltage generator 240 further supplies the bulk voltage for erase $V_{SBE}$ to the pass gates (i.e., the NMOS transistors) GD1 to GDK, G11 to G2J, . . . , GK1 to GKJ, GS1 to GSK of the block selection unit 260 in response to the erase command ERS. In this case, the operation of the NMOS transistors G21 to G2J, . . . , GK1 to GKJ, which are connected between the local word lines WL21 to WL2J, . . . , WLK1 to WLKJ of the memory cell blocks MB2 to MBK and the global word lines GWL1 to GWLJ, will be described in more detail with reference to FIGS. 9a and 9b. FIGS. 9a and 9b are a cross-sectional view of the NMOS transistor GK1 and the energy potential thereof, respectively. The operation of the NMOS transistors G21 to G2J, . . . , GK2 to GKJ is the same as that of the NMOS transistor GK1. Detailed description thereof will be thus omitted for simplicity.

Figure 9A:
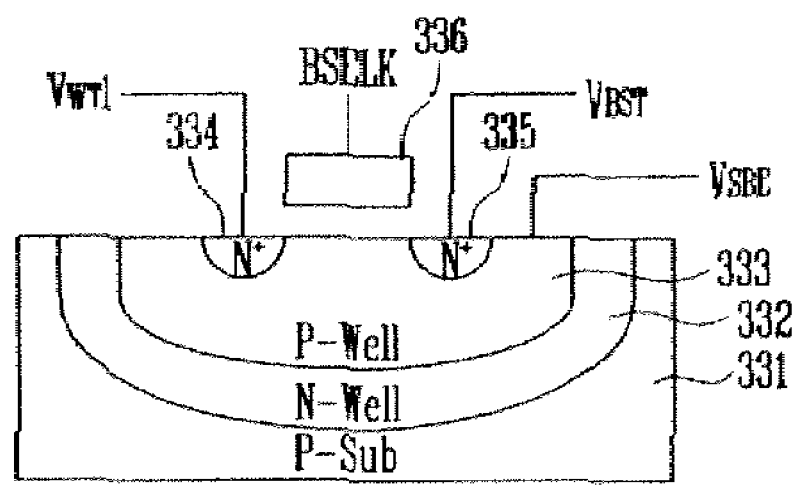
FIG. 9a is an exemplary cross-sectional view of the pass gate shown in FIG. 8.
Figure 9B:
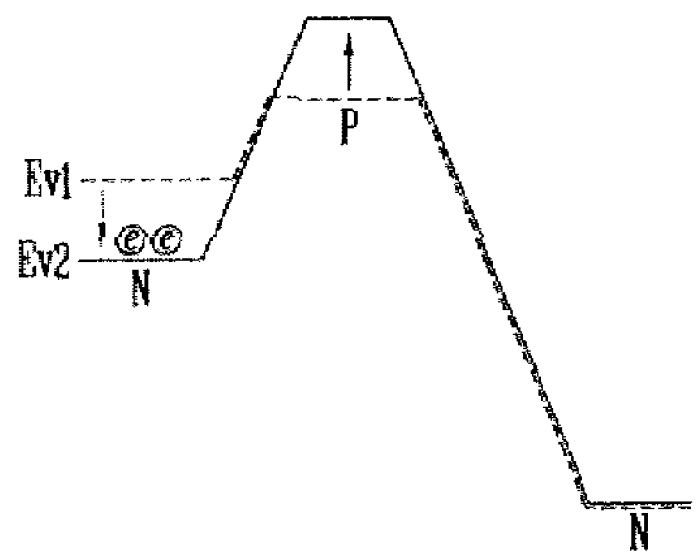
FIG. 9b is an exemplary view showing variations of the energy potential of the pass gate depending upon variations of the bias voltage and the bulk voltage of the word line shown in FIG. 8.

Referring to FIG. 9a, there is shown the cross-sectional view of the NMOS transistor GK1 connected to the local word line WLK1 of the memory cell block MBK. The NMOS transistor GK1 includes a substrate 331, a N-well 332, a P-well 333, a source 334, a drain 335 and a gate 336. To the source 334 is input a word line bias voltage $V_{WT}1$ having a positive value, and to the gate 336 is input a block select signal BSELK of a low (e.g., 0V) level. The drain 335 is also applied with a boosting voltage $V_{BST}$. As the block select signal BSELK is at a low level, the NMOS transistor GK1 is turned off. Further, because the word line bias voltage $V_{WT}1$ has the positive value, the energy potential of the source 334 region decreases to approximately Ev2 indicated by a solid line in FIG. 9b. Furthermore, because the bulk voltage for erase $V_{SBE}$ having the negative value is applied to the P-well 333, the energy potential of the P-well 333 increases to approximately Ev2 indicated by a solid line in FIG. 9b. Accordingly, as the amount of electrons introduced from the source 334 to the P-well 333 decreases, the amount of electrons introduced into the local word line WLK1 connected to the drain 335 is reduced. Consequently, the leakage current generated in the NMOS transistor GK1 in the erase operation of the flash memory device 100 can be higher than the leakage current of the NMOS transistor GK1 in the erase operation of the flash memory device 200. Meanwhile, in the event that the word line bias voltage $V_{WT}1$ of 0V is input to the source 334 and the reference bulk voltage $V_{SBR}$ of 0V is input to the P-well 333, the energy potential of the source 334 region increases and the energy potential of the P-well 333 decreases, to approximately Ev1 indicated by a dotted line of FIG. 9b. Accordingly, because the amount of electrons introduced from the source 334 to the P-well 333 increases, the leakage current of the NMOS transistor GK1 increases.

As described above, according to the present patent, a positive bias voltage is applied to a global word line in an erase operation. It is thus possible to prevent a shallow erase phenomenon of non-selected memory cell blocks due to the leakage current of pass gates.

Although the foregoing description has been made with reference to the various embodiments, it is to be understood that changes and modifications of the present patent may be made by the ordinary skilled in the art without departing from the spirit and scope of the present patent and appended claims.

What is claimed as new and desired to be protected by Letters Patent of the United States is:

1. A flash memory device, comprising:
  memory cell blocks, each having a plurality of memory cells sharing local word lines and bit lines;
  an X-decoder, which decodes a row, address signal and outputs a decoded signal;
  a block selection unit, which selects some of the memory cell blocks in response to the decoded signal, and connects local word lines of the selected memory cell blocks to corresponding global word lines, respectively, and
  a high voltage generator, which generates word line bias voltages in response to one of a read command, a program command and an erase command, and supplies the generated word line bias voltages to the global word lines in response to the decoded signal, respectively, wherein the word line bias voltages, which are generated by the high voltage generator in response to the erase command, have a positive value, respectively.

2. The flash memory device as claimed in claim 1, wherein the high voltage generator further generates a bulk voltage, a drain bias voltage and a source bias voltage of the memory cell in response to one of the read command, the program command and the erase command.

3. The flash memory device as claimed in claim 2, wherein the word line bias voltages, which are generated by the high voltage generator in response to the erase command, are lower than the bulk voltage of the memory cell, which is generated by the high voltage generator in response to the erase command, and
  a difference between the two voltages is higher than or approximately equal to 15V.

4. The flash memory device as claimed in claim 2, wherein the block selection unit includes a block switch unit that generates block select signals in response to the decoded signal; and pass gate circuits, which are disposed corresponding to the memory cell blocks, respectively, and are enabled or disabled in response to the block select signals, respectively, wherein the pass gate circuits connect the global word lines to corresponding local word lines of a memory cell block, respectively, when being enabled respectively.

5. The flash memory device as claimed in claim 2, wherein each of the pass gate circuits includes pass gates, which are connected between the global word lines and local word lines of a corresponding memory cell block, respectively, and are turned on or off at the same time in response to one of the block select signals.

6. The flash memory device as claimed in claim 5, wherein each of the pass gates is a MOS transistor having a single well structure.

7. The flash memory device as claimed in claim 5, wherein each of the pass gates has a MOS transistor having a triple well structure.

8. The flash memory device as claimed in claim 7, wherein the high voltage generator further supplies a bulk voltage for erase to some of the triple wells of the pass gates of the pass gate circuits in response to the erase command.

9. The flash memory device as claimed in claim 8, wherein the bulk voltage for erase has a negative value.

10. The flash memory device as claimed in claim 9, wherein the bulk voltage for erase is lower than a bulk voltage of the memory cell, which is generated by the high voltage generator in response to the erase command, and a difference between the two voltages is lower than or as approximately equal to a junction breakdown voltage of each of the pass gates.

11. The flash memory device as claimed in claim 1, wherein the high voltage generator includes:

a first bias voltage generator that generates a drain bias voltage and a source bias voltage in response to one of the read command, the program command and the erase command, and the decoded signal;

a second bias voltage generator, which generates read voltages, program voltages or an erase voltage as the word line bias voltages in response to one of the read command, the program command and the erase command, and the decoded signal, and supplies the word line bias voltages to the global word lines, respectively, and a bulk voltage generator that generates a bulk voltage of a memory cell in response to one of the read command, the program command and the erase command, wherein the erase voltage has a positive value and is lower than the bulk voltage of the memory cell, which is generated by the bulk voltage generator in response to the erase command, and wherein a difference between the two voltages is higher than or approximately equal to 15V.

12. The flash memory device as claimed in claim 11, wherein the second bias voltage generator includes:

a first pump circuit that generates the read voltages in response to the read command;

a second pump circuit that generates the program voltages in response to the program command;

a third pump circuit that generates the erase voltage in response to the erase command; and a bias voltage selection unit, which selects the read voltages, the program voltages or the erase voltage in response to the decoded signal, and outputs the selected voltages to the global word lines, respectively, as the word line bias voltages.

13. The flash memory device as claimed in claim 12, wherein the bias voltage selection unit includes:

a select signal generator that generates select signals according to the decoded signal; and select circuits, which are connected to the global word lines, respectively, and output one of the read voltages, the program voltages and the erase voltage to corresponding global word line, respectively, in response to the select signals.

14. The flash memory device as claimed in claim 7, wherein the high voltage generator includes:

a first bias voltage generator that generates a drain bias voltage and a source bias voltage in response to one of the read command, the program command and the erase command, and the decoded signal;

a second bias voltage generator, which generates read voltages, program voltages or an erase voltage as the word line bias voltages in response to one of the read command, the program command and the erase command, and the decoded signal, and supplies the word line bias voltages to the global word lines, respectively, and a bulk voltage generator that generates a bulk voltage of a memory cell in response to one of the read command, the program command and the erase command, wherein the erase voltage has a positive value and is lower than the bulk voltage of the memory cell, which is generated by the bulk voltage generator in response to the erase command, and wherein a difference between the two voltages is higher than or approximately equal to 15V.

15. The flash memory device as claimed in claim 14, wherein the high voltage generator further includes an additional bulk voltage generator, which generates a bulk voltage for erase in response to the erase command, and supplies the generated bulk voltage to some of triple wells of each of the pass gates of the each of the pass gate circuits, wherein the bulk voltage for erase has a negative value and has a difference with the bulk voltage of the memory cell, which is generated by the bulk voltage generator in response to the erase command, the difference being lower than or approximately equal to a junction breakdown voltage of each of the pass gates.

16. The flash memory device as claimed in claim 15, wherein the additional bulk voltage generator includes:

a pump circuit that generates the bulk voltage for erase in response to the erase command; and a bulk voltage selection unit, which receives a reference bulk voltage, selects one of the reference bulk voltage and the bulk voltage for erase in response to a select control signal, and outputs the selected voltage to some of the triple wells of each of the pass gates of the each of the pass gate circuits.

17. The flash memory device as claimed in claim 16, wherein when the erase command is enabled, the select control signal is enabled, when the select control signal is enabled, the bulk voltage selection unit selects the bulk voltage for erase, and when the select control signal is disabled, the bulk voltage selection unit selects the reference bulk voltage.

18. A method of controlling an erase operation of a flash memory device, comprising the steps of:

supplying word line bias voltages, each having a positive value, to global word lines, respectively, in response to an erase command and a row address signal;

supplying a bulk voltage to memory cells of the each of the memory cell blocks;

floating drains and sources of the memory cells by supplying a ground voltage to a global drain select line and a global source select line; and selecting one of the memory cell blocks in response to the row address signal, and connecting local word lines of the selected memory cell block to the global word lines.

19. The method as claimed in claim 18, wherein supplying the word line bias voltages includes:

decoding the row address signal, and outputting a decoded signal;

generating an erase voltage having a positive value in response to the erase command; and outputting the erase voltage to the global word lines, respectively, as the word line bias voltages in response to the decoded signal.

20. The method as claimed in claim 19, wherein the erase voltage is lower than a bulk voltage supplied to the memory cells, and a difference between the bulk voltage and the erase voltage is higher than or approximately equal to 15V.

21. The method as claimed in claim 18, wherein selecting the memory cell block and connecting the word lines includes:

decoding the row address signal, and outputting the decoded signal;

outputting block select signals in response to the decoded signal; and enabling one of pass gate circuits, which are disposed between the global word lines and the memory cell blocks, respectively, in response to the block select signals, and connecting the global word lines and the local word lines of one of the memory cell blocks.

22. The method as claimed in claim 21, further including supplying a bulk voltage for erase to some of triple wells of MOS transistors having a triple well structure, which are pass gates included in the pass gate circuits, respectively.

23. The method as claimed in claim 22, wherein the bulk voltage for erase has a negative value, and has a difference with the bulk voltage supplied to the memory cells, the difference being lower than or approximately equal to a junction breakdown voltage of each of the pass gates.

* * * * *